（12）United States Patent
Lucantonio

(10) Patent No.: US 10,432,195 B2
(45) Date of Patent: Oct. 1, 2019

(54) POWER OUTLET SOCKET SENSOR SWITCH

(71) Applicant: Connected Group Australia Pty Ltd, Lurnea NSW (AU)

(72) Inventor: Dean Lucantonio, Parramatta NSW (AU)

(73) Assignee: CONNECTED GROUP AUSTRALIA PTY LTD, Wetherill Park (AU)

( * ) Notice: Subject to any disclaimer, the term of this patent is extended or adjusted under 35 U.S.C. 154(b) by 846 days.

(21) Appl. No.: 14/784,269

(22) PCT Filed: Apr. 11, 2014

(86) PCT No.: PCT/AU2014/000403
§ 371 (c)(1),
(2) Date: Oct. 13, 2015

(87) PCT Pub. No.: WO2014/169324
PCT Pub. Date: Oct. 23, 2014

(65) Prior Publication Data
US 2016/0126950 A1   May 5, 2016

(30) Foreign Application Priority Data

Apr. 14, 2013 (AU) .................................. 2013100505
Apr. 14, 2013 (AU) .................................. 2013100507
Apr. 14, 2013 (AU) .................................. 2013205636

(51) Int. Cl.
*H03K 17/955* (2006.01)
*H01R 13/70* (2006.01)
*H01R 13/66* (2006.01)
*H01R 25/00* (2006.01)
*H01R 24/30* (2011.01)
(Continued)

(52) U.S. Cl.
CPC ....... *H03K 17/955* (2013.01); *H01R 13/6683* (2013.01); *H01R 13/70* (2013.01); *H01R 24/30* (2013.01); *H01R 25/006* (2013.01); *H01R 2103/00* (2013.01); *H01R 2107/00* (2013.01); *H03K 17/941* (2013.01); *H03K 2217/94106* (2013.01); *H03K 2217/94108* (2013.01)

(58) Field of Classification Search
None
See application file for complete search history.

(56) References Cited

U.S. PATENT DOCUMENTS 6,731,024 B1   5/2004   Molnar et al.
2003/0222508 A1   12/2003   Maxwell et al.

FOREIGN PATENT DOCUMENTS

WO   WO 2006/056814   6/2006
WO   WO 2006056814 A1 *   6/2006   ......... H05B 37/0227
WO   WO 2010/041085   4/2010

\* cited by examiner

*Primary Examiner* — Jared Fureman
*Assistant Examiner* — David M Stables
(74) *Attorney, Agent, or Firm* — Knobbe Martens Olson & Bear, LLP

(57) ABSTRACT

A mains electrical power outlet assembly; said power outlet assembly including at least one power outlet socket; said power outlet assembly including at least one sensing module, operating a power switching module and a microprocessor; said sensing module including a sensor responsive to proximity to said sensor of selected objects; proximity of a said selected object switching status of a said power outlet socket from a current state to another state.

7 Claims, 12 Drawing Sheets

(51) Int. Cl.
*H01R 103/00* (2006.01)
*H03K 17/94* (2006.01)
*H01R 107/00* (2006.01)

POWER OUTLET SOCKET SENSOR SWITCH

RELATED APPLICATIONS

This application is the U.S. National Phase of PCT/AU2014/000403 filed Apr. 11, 2014 and claims priority to Australian Provisional Patent Application No. 2013100505 filed Apr. 14, 2013, Australian Provisional Patent Application No. 2013100507 filed Apr. 14, 2013, and Australian Provisional Patent Application No. 2013205636 filed Apr. 14, 2013, which are hereby incorporated by reference herein in their entirety.

The present invention relates to control of electrical devices and, more particularly, to switching of light sources and power outlets.

BACKGROUND

Switching mechanisms that control lights and power outlets in mains power applications have long relied on mechanical connections between moveable elements within the switch assembly, typically by a toggle mechanism. Such switches are vulnerable to wear and damage as well as to arcing with possible attendant safety issues.

Moreover, particularly in domestic applications, it is desirable to provide dimming of the light source or sources controlled by a switch, requiring the provision of an external rotatable knob connected to a mechanically realized potentiometer mounted behind the switch plate. Again such projecting knobs are vulnerable to damage and may be dislodged and lost.

A standard wall plate or switch panel is limited in the number of toggle light switches it can accommodate. This is particularly so where dimming of the lights controlled from the panel is also desired.

Mechanical switches are also inflexible, in that they are dedicated to the particular light or device to which they are wired. There are also limitations in these types of switches in intermediate switching applications where it is desired to control a light source or other electrical device from a number of separate locations.

Toggle switches and rotatable dimming knobs may also present problems for people with disabilities, for example for hands and fingers affected by arthritis.

Conventional toggle switch controlled power outlets are a safety hazard for small children and although precautions can be taken by the insertion of a plug into the outlet's sockets, this is an awkward solution and its implementation easily forgotten or omitted.

Power switching of light circuits by means of proximity sensing is known. US2003/0222508 by Maxwell discloses a switch in which a variation in capacitance due to an object brought into close proximity, switches the circuit. A disadvantage of the system disclosed in Maxwell is that it is directed at the control of light circuits only.

It is an object of the present invention to address or at least ameliorate some of the above disadvantages.

Notes

The term "comprising" (and grammatical variations thereof) is used in this specification in the inclusive sense of "having" or "including", and not in the exclusive sense of "consisting only of".

The above discussion of the prior art in the Background of the invention, is not an admission that any information discussed therein is citable prior art or part of the common general knowledge of persons skilled in the art in any country.

BRIEF DESCRIPTION OF INVENTION

A mains electrical power outlet assembly; said power outlet assembly including at least one power outlet socket; said power outlet assembly including at least one sensing module operating a power switching module and a microprocessor; said sensing module including a sensor responsive to proximity to said sensor of selected objects; proximity of a said selected object switching status of a said power outlet socket from a current state to another state.

Preferably said microprocessor of said assembly is programmable and reprogrammable; said assembly including an infrared transmitter and receiver module; said module adapted to receive programming data via an infrared data stream from a remote infrared data transmitter; said data stream passing to said module via a light guide provided between an upper rim of a face plate of said assembly and said module.

Preferably said assembly is provided with an automatic dimming of light emitters; said light emitters indicating status of power switches of said assembly; an ambient light sensor reacting to ambient light at said switch assembly; said ambient light sensor receiving ambient light input via a light guide provided between said upper rim of said face plate of said assembly and said ambient light sensor.

Preferably said at least one power outlet socket is switched to a locked deactivated state if a sensible object remains within sensing distance of an associated said sensor of said at least one power outlet socket for at least a first predetermined duration; said locked deactivated state being reversed to an activated state when a said sensible object is maintained within said sensing distance of said associated sensor for at least a second predetermined duration.

In a further broad form of the invention there is provided method of switching at least one conductor of a mains alternating power supply from a deactivated state to an activated state and from an activated state to a deactivated state; said method including the steps of:

bringing a sensible object within sensing range of a sensor of a switch assembly in a first instance, bringing said sensible object within sensing range of said sensor of said switch assembly in a second instance, and wherein said switch assembly includes a sensing module for sensing the sensible object and a power switching module in communication with the sensing module for switching the state of the at least one conductor.

In yet a further broad form of the invention there is provided electrical power programmable switch assembly; said switch assembly including a face plate releasably mounted to a supporting body element; said supporting body element including a housing containing a proximity sensing module and a power switching module; said switch assembly adapted for switching mains power between power on and power off states through a sensible object being brought into sensing proximity of said switch assembly; said switch assembly further including a sensor for receiving data input from a remote data emitter; said data being received into non-volatile memory for execution of programmed operation of said switch assembly by a microprocessor.

Preferably said sensor for receiving data comprises an infrared transmitter and receiver; said sensor receiving input infrared via a light guide arranged between an upper rim of said face plate and said sensor.

Preferably each switch of said switch assembly includes a proximity sensor and a light emitter; said light emitter indicating status of a said switch through colour coded light emitted through said face plate.

Preferably said assembly further includes an ambient light sensor; said microprocessor modulating said light emitted through said face plate according to ambient light sensed by said ambient light sensor; said ambient light sensor receiving light via a light guide arranged between an upper rim of said face plate and said ambient light sensor.

In yet a further broad form of the invention there is provided a method of programming a power switch assembly; said power switch assembly including a proximity sensing module for switching said power switch assembly between power on and power off states when a sensible object is brought within sensing distance of said power switch assembly; said method including the steps of:
  (a) providing said power switch assembly with an infrared transmitter and receiver,
  (b) providing said power switch assembly with a light guide for transmission of infrared data signal to said infrared transmitter and receiver,
  (c) sending said infrared data signal to said light guide from a remote infrared data signal device,
preferably maintaining said sensible object within said sensing distance of said sensor in a first instance activates a dimming element to dim a light source connected to said switch system to a dimmed state; dimming of said light source progressing towards a minimum luminescence proportional to duration of said sensible object remaining within said sensing distance of said sensor.

Preferably said light source is re-activated in said dimmed state if in a previous activation said light source was dimmed to said dimmed state; said dimmed state being reversed towards a maximum luminescence proportional to duration of said sensible object remaining within said sensing distance.

Preferably said system includes at least one power outlet socket; activation of a said power outlet socket effected by bringing a sensible object within sensing distance of a said sensor associated with a power switching relay or relays of said power socket.

Preferably said at least one power socket is switched to a locked deactivated condition if a sensible object remains within sensing distance of an associated said sensor for at least a first predetermined duration.

Preferably a said locked deactivated condition of a said power socket is reversed to an activated condition when a said sensible object is maintained within sensing distance of said associated sensor for at least a second predetermined duration.

Preferably said assembly includes an RF transmitter module; said RF transmitter module adapted for wireless communication with one or more selected RF receiver modules connected to at least one electrical device or included in one or more other said switch assemblies.

Preferably said assembly includes an RF receiver module; said RF receiver module adapted to receive communication wirelessly from other said switch assemblies in an array of said switch assemblies or from a remote control RF device; at least one said switch assembly in said array including both an RF receiver and an RF transmitter module.

Preferably any one of a number of said switch assemblies in a said array of switch assemblies is enabled to activate a light source or other electrical device connected to any one of said switch assemblies in said array.

Preferably said microprocessor is re-programmable; an input port accessible behind said face plate providing connection to a program loading device.

In yet a further broad form of the invention there is provided a method of switching a mains alternating power supply from a deactivated state to an activated state and from an activated state to a deactivated state; said method including the steps of:
  bringing a sensible object within sensing range of a sensor of a switch assembly in a first instance,
  bringing said sensible object within sensing range of said sensor of said switch assembly in a second instance, and
  wherein said sensor combines the functionality of a proximity sensor and a light emitter; said light emitter changing colour of emitted light from a first colour to a second colour at said first instance and changing colour from said second colour back to said first colour at said second instance, and wherein switching and colour changes are controlled by a programmable microprocessor.

Preferably maintaining said sensible object within said sensing distance after said first instance causes a dimming of a light source connected to said power supply; said dimming proportional to a length of time said sensible object remains within said sensing distance.

Preferably maintaining said sensible object within said sensing distance after said second instance causes a reversal of said dimming of said light source; said reversal being proportional to a length of time said sensible object remains within said sensing distance.

Preferably maintaining said sensible object within said sensing distance after said first instance for a first predetermined time prevents said power supply being provided to power outlet sockets of said switching system.

Preferably maintaining said sensible object within said sensing distance after said second instance for a second predetermined time allows said power supply to be provided to said power outlet sockets.

In yet a further broad form of the invention there is provided a method of controlling light sources and other electrical devices powered by a mains alternating power supply; said controlling enabled from a plurality of locations; said method including the steps of:
  providing an array of switch assemblies; each said switch assembly including at an RF receiver module, and an RF transmitter module;
  providing communication between switch assemblies of said array of switch assemblies,
  providing communication between at least one of said switch assemblies and each of said light sources and said electrical devices; and
  wherein each of said switch assemblies further includes a microprocessor and at least one power switch; said power switch including a sensor.

Preferably said light sources and said electrical devices are connected to at least one of said switching assemblies by hard wiring.

Preferably said light sources and said electrical devices communicate with any one of said switching assemblies by means of RF transmitting and receiving modules.

Preferably the state of a said power switch of a said switching assembly may be changed between an activated and a deactivated state by means of RF communication between a remote control device and a said RF receiver module of said switch assembly.

In yet a further broad form of the invention there is provided and electrical switch assembly for switching the state of at least one conductor of a mains alternating power supply; said electrical switch assembly including a housing containing a sensing module and a power switching module; said switch assembly characterized in that electrical power switched by said switch assembly is mains alternating power; said switch assembly including a microprocessor in communication with the sensing module and the power switching module for switching the state of the at least one conductor; said assembly including an internal load in series with said at least one conductor and wherein a voltage drop across said internal load is utilised to provide power to said microprocessor during at least a portion of the operating cycle of the switch assembly.

Preferably the power switching module includes a relay and the assembly utilises voltage drop across terminals of the relay of the power switching module to provide power to said microprocessor.

Preferably the assembly utilises voltage drop across the relay terminals of the power switching module to provide power to said microprocessor as a first choice and utilises the voltage drop across said internal load to provide power to said microprocessor as a second choice.

Preferably the above described assembly includes an ambient light sensor in communication with the microprocessor; the microprocessor programmed to increase output voltage from the switch assembly as the amount of ambient light sensed by the ambient light sensor reduces thereby to increase the light output from lights supplied by the switch assembly as ambient light decreases.

In yet a further broad form of the invention there is provided a method of switching at least one conductor of a mains alternating power supply from a deactivated state to an activated state and from an activated state to a deactivated state; said method including the steps of:

bringing a sensible object within sensing range of a sensor of a switch assembly in a first instance, bringing said sensible object within sensing range of said sensor of said switch assembly in a second instance, said assembly including an internal load in series with said at least one conductor and wherein a voltage drop across said internal load is utilised to provide power to internal components of the switch assembly during at least a portion of the operating cycle of the switch assembly.

Accordingly, in a further broad form of the invention, there is provided an electrical power switch assembly; said switch assembly including a face plate releasably mounted to a supporting body element; said supporting body element including a housing containing a sensing module and a power switching module; said switch assembly characterized in that electrical power switched by said switch assembly is mains alternating power; each said switch assembly including at least one power switch and a microprocessor; each said power switch including a sensor.

Preferably, switching of electrical power is effected by solid state components only.

Preferably, switching of electrical power is effected by double pole relays.

Preferably, each switch of said switch assembly includes a proximity sensor and a light emitter.

Preferably, said face plate includes a transparent front plate; a rear face of said front plate provided with an opaque layer; at least one clear annular ring in said opaque layer permitting transmission of light through said transparent front plate.

Preferably, said transparent front plate is mounted to a perimeter frame; said perimeter frame provided with snap-fit elements for releasable connection to a perimeter rim of a mounting plate of said housing.

Preferably, said mounting plate is adapted for screwed attachment to standard wall plate mounting brackets.

Preferably, said sensing module comprises a sensor printed circuit board; said sensor printed circuit board supporting at least one said sensor; a said sensor located on said sensor printed circuit board so as to align said sensor with said clear annular ring, when said sensor printed circuit board is assembled in said housing and said face plate assembly is attached to said perimeter rim.

Preferably, said sensor is a capacitance sensor provided with an LED backlight.

Preferably, said backlight emits a first colour when said proximity sensor is in a deactivated state; said backlight emitting a second colour when said proximity sensor is in an activated state.

Preferably, said proximity sensor causes closure of a relay or relays on a first sensing of a sensible object brought into sensing distance of said sensor; said proximity sensor causing re-opening of said relay or relays on a subsequent approach of a said sensible object to within said sensing distance.

Preferably, maintaining said sensible object within said sensing distance of said sensor in a first instance activates a dimming element to dim a light source connected to said switch system to a dimmed state; dimming of said light source progressing towards a minimum luminescence proportional to duration of said sensible object remaining within said sensing distance of said sensor.

Preferably, said light source is re-activated in said dimmed state if in a previous activation said light source was dimmed to said dimmed state; said dimmed state being reversed towards a maximum luminescence proportional to duration of said sensible object remaining within said sensing distance.

Preferably, said system includes at least one power outlet socket; activation of a said power outlet socket effected by bringing a sensible object within sensing distance of a said sensor associated with a power switching relay or relays of said power socket.

Preferably, said at least one power socket is switched to a locked deactivated condition if a sensible object remains within sensing distance of an associated said sensor for at least a first predetermined duration.

Preferably, a said locked deactivated condition of a said power socket is reversed to an activated condition when a said sensible object is maintained within sensing distance of said associated sensor for at least a second predetermined duration.

Preferably, said assembly includes an RF transmitter module; said RF transmitter module adapted for wireless communication with one or more selected RF receiver modules connected to at least one electrical device or included in one or more other said switch assemblies.

Preferably, said assembly includes an RF receiver module; said RF receiver module adapted to receive communication wirelessly from other said switch assemblies in an array of said switch assemblies or from a remote control RF device; at least one said switch assembly in said array including both an RF receiver and an RF transmitter module.

Preferably, any one of a number of said switch assemblies in a said array of switch assemblies is enabled to activate a light source or other electrical device connected to any one of said switch assemblies in said array.

Preferably, said microprocessor is re-programmable; an input port accessible behind said face plate providing connection to a program loading device.

In another broad form of the invention, there is provided a method of switching a mains alternating power supply from a deactivated state to an activated state and from an activated state to a deactivated state; said method including the steps of:
(a) bringing a sensible object within sensing range of a sensor of a switch assembly in a first instance,
(b) bringing said sensible object within sensing range of said sensor of said switch assembly in a second instance, and
wherein said sensor combines the functionality of a proximity sensor and a light emitter; said light emitter changing colour of emitted light from a first colour to a second colour at said first instance and changing colour from said second colour back to said first colour at said second instance, and wherein switching and colour changes are controlled by a programmable microprocessor.

Preferably, maintaining said sensible object within said sensing distance after said first instance causes a dimming of a light source connected to said power supply; said dimming proportional to a length of time said sensible object remains within said sensing distance.

Preferably, maintaining said sensible object within said sensing distance after said second instance causes a reversal of said dimming of said light source; said reversal being proportional to a length of time said sensible object remains within said sensing distance.

Preferably, maintaining said sensible object within said sensing distance after said first instance for a first predetermined time prevents said power supply being provided to power outlet sockets of said switching system.

Preferably, maintaining said sensible object within said sensing distance after said second instance for a second predetermined time allow said power supply being provided to said power outlet sockets.

In another broad form of the invention, there is provided a method of controlling light sources and other electrical devices powered by a mains alternating power supply; said controlling enabled from a plurality of locations; said method including the steps of:
(a) providing an array of switch assemblies; each said switch assembly including at an RF receiver module, and an RF transmitter module;
(b) providing communication between switch assemblies of said array of switch assemblies,
(c) providing communication between at least one of said switch assemblies and each of said light sources and said electrical devices; and
wherein each of said switch assemblies further includes a microprocessor and at least one power switch; said power switch including a sensor.

Preferably, said light sources and said electrical devices are connected to at least one of said switching assemblies by hard wiring.

Preferably, said light sources and said electrical devices communicate with any one of said switching assemblies by means of RF transmitting and receiving modules.

Preferably, the state of a said power switch of a said switching assembly may be changed between an activated and a deactivated state by means of RF communication between a remote control device and a said RF receiver module of said switch assembly.

BRIEF DESCRIPTION OF DRAWINGS

Embodiments of the present invention will now be described with reference to the accompanying drawings wherein.

DETAILED DESCRIPTION OF PREFERRED EMBODIMENTS

In this specification:
"wall plate" signifies a plate mounted to a wall or other supporting surface and incorporating one or more power switches or power switches and power outlets.
"mounting bracket" signifies any one of a number of brackets for recessed mounting in plaster board (or wall board), wood framed walls (stud mounting) or other types of wall construction.
"capacitance sensor" signifies a proximity sensor based on capacitance coupling effects and reacting to the proximity of a certain range of objects.
"RF" receiver or transmitter module signifies a Radio Frequency device able to either receive radio signals from a remote device, or transmit radio signals to a remote device.
"sensible object" is any object which the sensor switch is able to detect and respond to. This may include the human hand or a part thereof such as a finger.

First Preferred Embodiment

Figure 1:
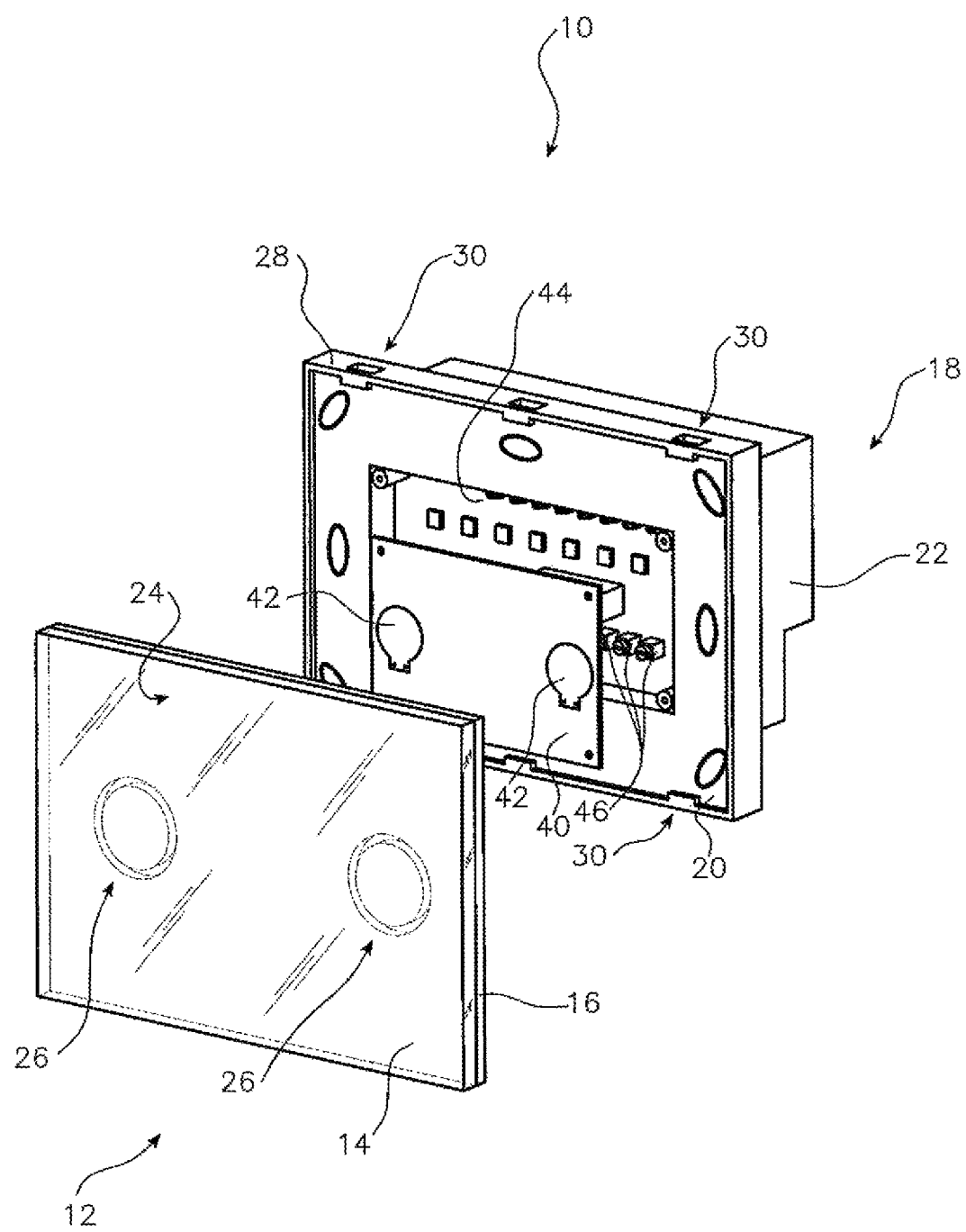
FIG. 1 is an exploded perspective view of a first preferred embodiment of a switch assembly according to the present invention.
Figure 2:
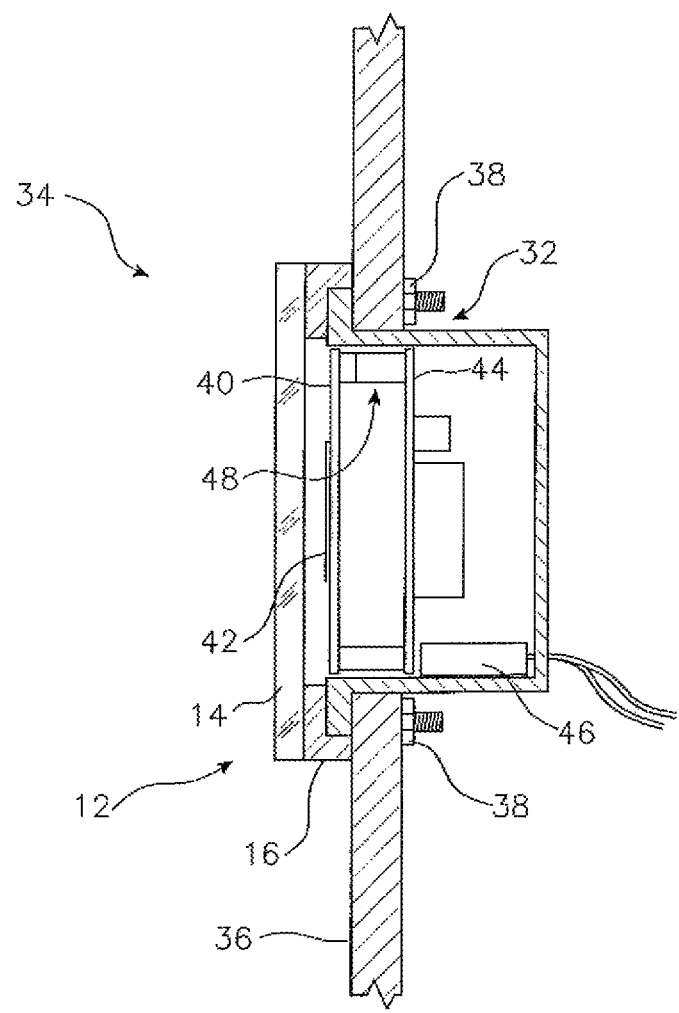
FIG. 2 is a partially sectioned side view of the switch assembly of FIG. 1 mounted in a wall of a building.

With reference to FIGS. 1 and 2, in this first preferred embodiment of the invention, an alternating current, mains power switch assembly generally designated by the numeral 10, comprises an assembly of one or more power switches for operating light sources or other electrical equipment. Switch assembly 10 includes a face plate assembly 12 comprising a transparent front plate 14 mounted to a perimeter frame 16, and a body element 18 comprising a mounting plate 20 and integral housing 22.

Preferably the transparent front plate 14 is of glass and has a rear surface covered with an opaque layer 24. Inscribed in this opaque layer 24 is at least one clear annular circle 26 through which light can pass, for each power switch. The exemplary switch system illustrated in FIG. 1 has two separate switches, but it will be appreciated that the relatively small area required by each switch, allows a standard sized wall plate to accommodate a relatively large number of switches.

The perimeter frame 16 is releasable attached to a perimeter rim 28 of the mounting plate 20 by means of snap-fit elements 30 (only those on the rim 28 being visible in FIG. 1).

The mounting plate 20 and housing 18 are sized and configured to allow mounting in a standard opening 32 in a building wall 34 (such as the plaster or wall board wall 36 shown in FIG. 2), and attachment to light switch and power point mounting brackets 38 standard in the industry. When mounted in a wall or other supporting surface, only the transparent front plate and its perimeter frame 16 project from a wall or other mounting surface, as shown in FIG. 2.

Located immediately behind the rear surface of the transparent front plate 14 is a sensor printed circuit board 40. At least one sensor 42 is mounted to the front surface of the sensor circuit board 40, located so that each sensor 42 is positioned directly behind a corresponding clear annular circle 26 of the transparent front plate 14 when the circuit board 40 is assembled within housing 22, and face plate assembly 12 is attached to the rim 28.

Mounted within the housing 22 itself, is a second or main printed circuit board 44 which carries relays, one or more microprocessor logic chips, circuitry and associated components, as well as wiring terminal blocks 46. In at least some embodiments, as more fully described below, the components may include either or both RF transmitting and RF receiver modules. Connection between the sensor circuit board 40 and the main printed circuit board 44 is by means of a multi-pin plug and socket connector 48.

Sensor or sensors 42 combine the functions of a proximity sensor switch and a light emitter. Preferably the sensor comprises a capacitance sensor provided with an LED backlight. When installed and connected to a power grid in a building, the light emitted by the sensor 42 when the proximity sensor switch is in a deactivated state, defaults to a first colour, for example blue to indicate that the switch is "off". When the sensor detects a sensible object brought to within its sensing range and the switch is activated, the light emitted changes to a second colour, for example orange, thereby indicating that the switch is "on". A next brief approach by a sensible object returns the switch to the "off" condition and the emitted colour back to the default first colour.

The sensors 42 of the system are sensitive to a finger brought momentarily into contact with, or passing close to, the outer surface of transparent front plate 14. Such an approach by a finger will thus cause the sensor to activate the switch, tripping the associated relay, (in case of a single pole arrangement), or relays (if a double pole arrangement), allowing current to flow to the light or other device connected to, or controlled by, the switch system 10.

Preferably, the system 10 includes a potentiometer component or dimming element for each switch arrangement to allow dimming of a light source. By a user maintaining a finger within the sensing distance of a sensor, (and after the switch has been triggered to "on" by a first approach of the finger), the dimming element acts to dim the light source connected to the switch. The dimming is progressive in accordance with the length of time the user keeps the finger within the sensing distance.

Figure 4:
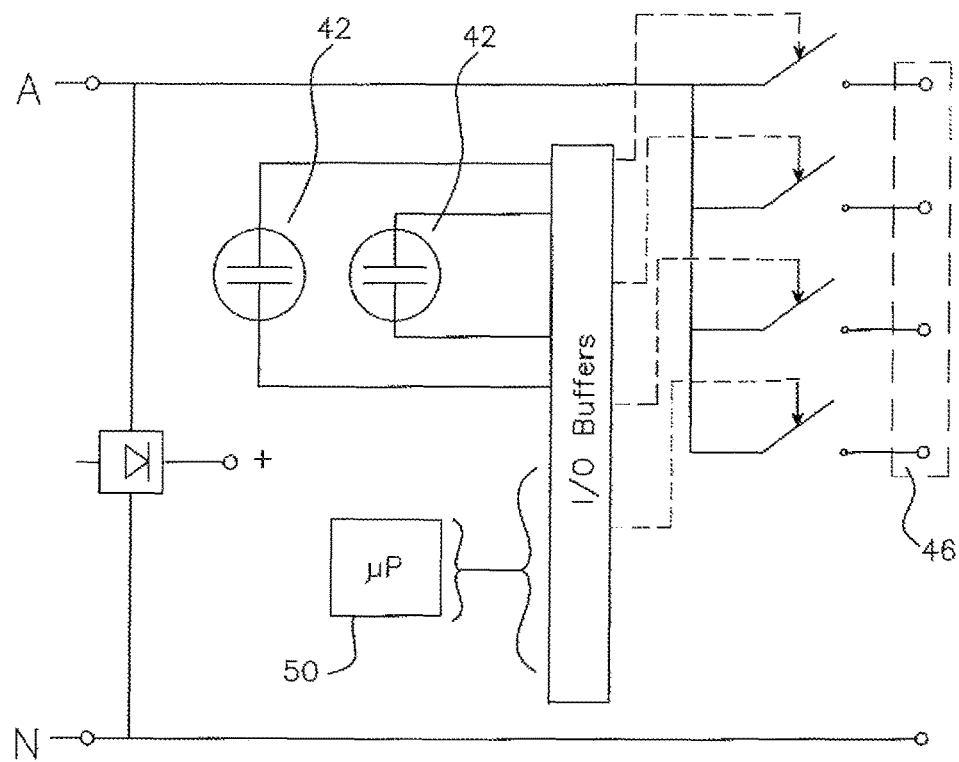
FIG. 4 is a schematic circuit diagram of the principle components of the switch assembly of FIGS. 1 to 4.

The level of dimming is retained in memory so that at the next activation of the light source, the luminescence previously set is reinstated. Holding the finger in the sensing position reverses the dimming towards the maximum luminescence, with the extent of the reversal depending on the length of time the finger is held within the sensing distance. A microprocessor (FIG. 4) controls the logic sequences of switching and dimming, and also controls the operation of the RF receiver and transmitter modules where these are fitted.

Second Preferred Embodiment

Figure 3:
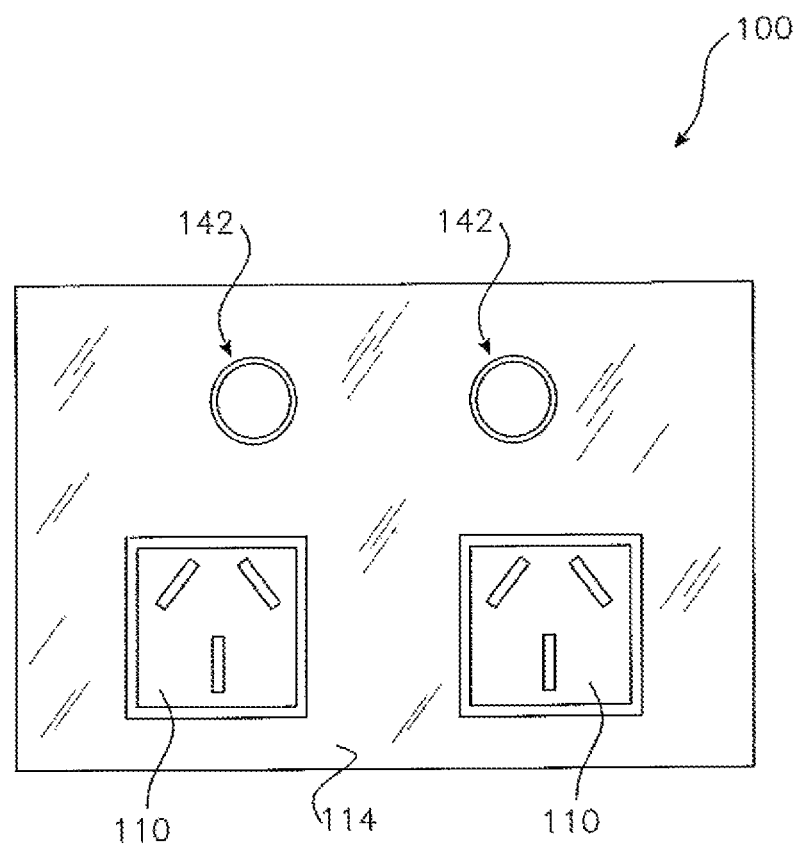
FIG. 3 is a front view of a further preferred embodiment of a switch assembly according to the invention.

In a second preferred embodiment, the switch system 100 controls one or preferably two power outlet sockets 110 as shown in FIG. 3. Each sensor 142 controls an associated power outlet socket mounted within apertures provided in the transparent front plate 114. In this case, with the exception of the dimmer function described above, the sensors, indicating colours, relay or relays switching are as described for the first preferred embodiment above. However, instead of relays controlling a remote light source or other device, the triggering of a sensor switches power to its corresponding power outlet socket either to "on" or to "off". The light emitter changes colour accordingly, again, as described above.

Preferably, circuitry in the present embodiment is responsive to a user's finger remaining within sensing range for longer than a first predetermined length of time. By this means, a power outlet socket may be locked in an "off" status, when switching from a present "on" status, or when the switch is already "off". In this locked condition, power cannot be switched on by a momentary passing of a finger through the sensing area of the sensor but must be deliberately maintained within the sensing distance of the sensor for a second, longer length of time to re-activate the power outlet socket.

For example, an outlet may be locked into an "off" status by retaining a finger within the sensing distance for more than five seconds, while the unlocking may require more than ten seconds. In one preferred arrangement, the indicating blue "off" light may be set to flash at intervals to show the power outlet socket is in the locked "off" condition.

Third Preferred Embodiment

In a third preferred embodiment of the invention, again the construction, sensing, switching and switch status indication are similar to that described in the first and second preferred embodiments above. In this embodiment however the sensing system activates or de-activates an RF (Radio Frequency) transmitter mounted to the main circuit board or otherwise retained within the housing.

The sensing of a user's finger in this embodiment will cause the RF transmitter to send either an "on" or "off" signal pulse to an RF receiver mounted at the light source or other device associated with the switch assembly.

Fourth Preferred Embodiment

In this further preferred embodiment according to the invention, the switch system may incorporate an RF receiver module, either instead of or in addition to, the RF transmitter module of the third embodiment above. By means of an inbuilt RF receiver module, the switch or switches of the switch assembly may be operated from a remote control RF transmitter.

When fitted with both RF receiver and transmitter modules, each switch assembly in a building can be operated wirelessly from some central location or remote control module. In the case of light switches at least, all the lights in a building may be controlled in this manner.

Fitting each switching assembly in an array of switching assemblies with both an RF receiving and an RF transmitting module, allows the switches to communicate intelligently as programmed through their respective microprocessors. By this means one or more light sources or other electrical devices may be controlled from any of the switch assemblies in the array in the manner of a intermediate switching arrangement.

A particular feature of the present invention is the incorporation of at least one microprocessor in each switch assembly. This element provides flexibility in the programming of the switch operation and the response to signals received or the format of transmissions to other switches and RF receiver enabled devices in a building's power distribution system.

In a preferred arrangement, the circuit board of the switch assembly may include an input socket, such as a USB port for example, accessible after removal of the face plate, to enable reprogramming of the switching and any RF module functions.

Further Preferred Embodiments

Automatic Dimming of Switch Status Indicator

Figure 6:
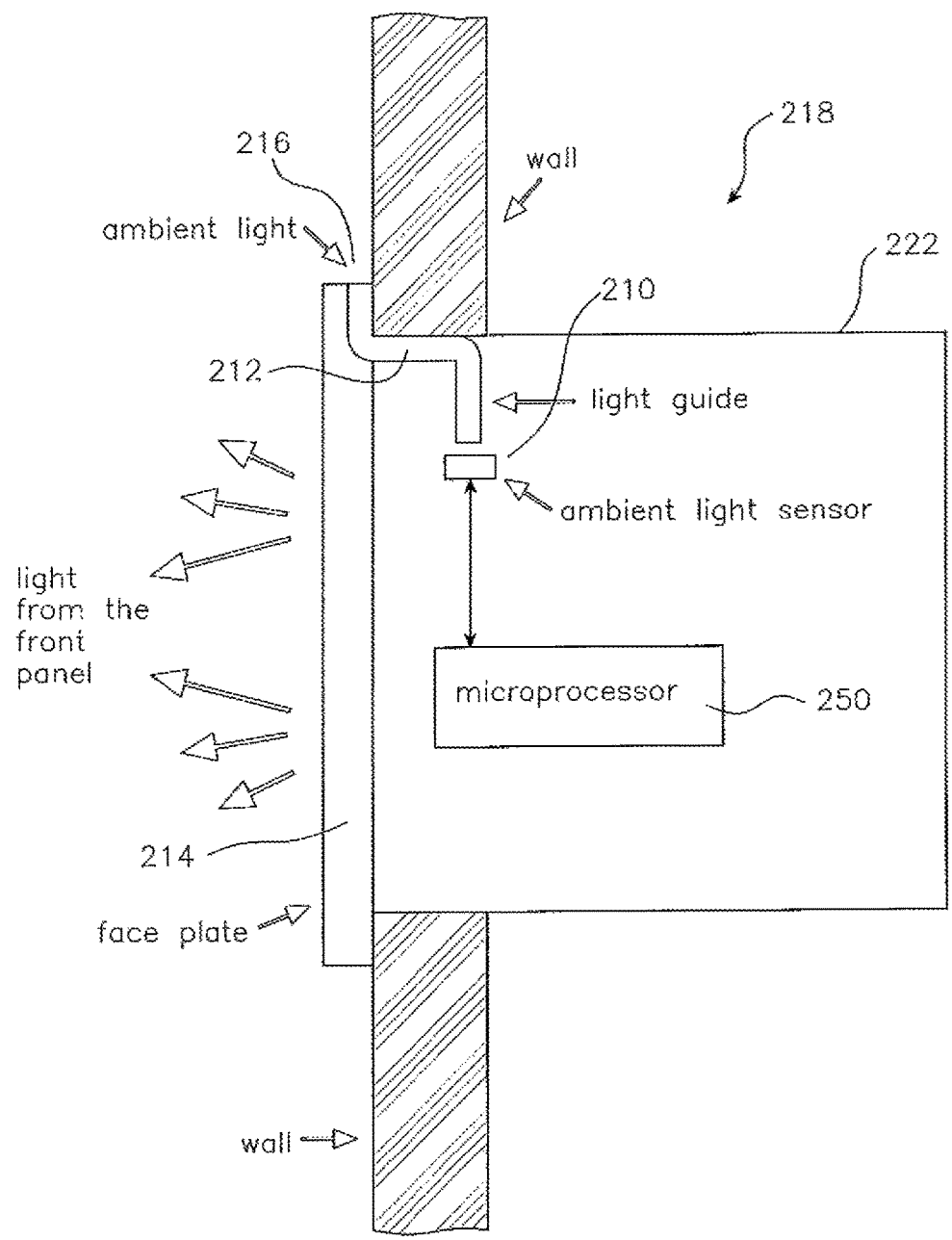
FIG. 6 is a schematic sectioned view of a power switch assembly according to the invention provided with an ambient light sensing facility.

With reference now to FIG. 6, in a further preferred embodiment a power switch 200 according to the invention is provided with an ambient light sensing facility. In order to avoid the problem in which the illumination of the light emitter or emitters 42,142 (see FIGS. 1 and 3), which indicate the various functions and status of the switch through rings in the face plate 14,114, is either too bright during the night or too dull during the day, the brightness of the indicators is modulated according to the ambient light at the switch 218.

In a preferred arrangement, this is accomplished as shown in FIG. 6 by placing an ambient light sensor 210 in such a way that it can respond to the ambient light in the room without it being influenced by the light from the indicators 42,142. A light guide 212, for example a fiberoptic bundle, is incorporated partly in the face plate 214 such that its light entry end 216 is located in the upper rim of face plate 214 and leads to the ambient light sensor 210 located within the housing 222.

Ambient light sensor 210 communicates with microprocessor 250 which controls the light issuing from indicator rings 42,142 as described in the embodiments above.

Remote Programming of Switches

Figure 7:
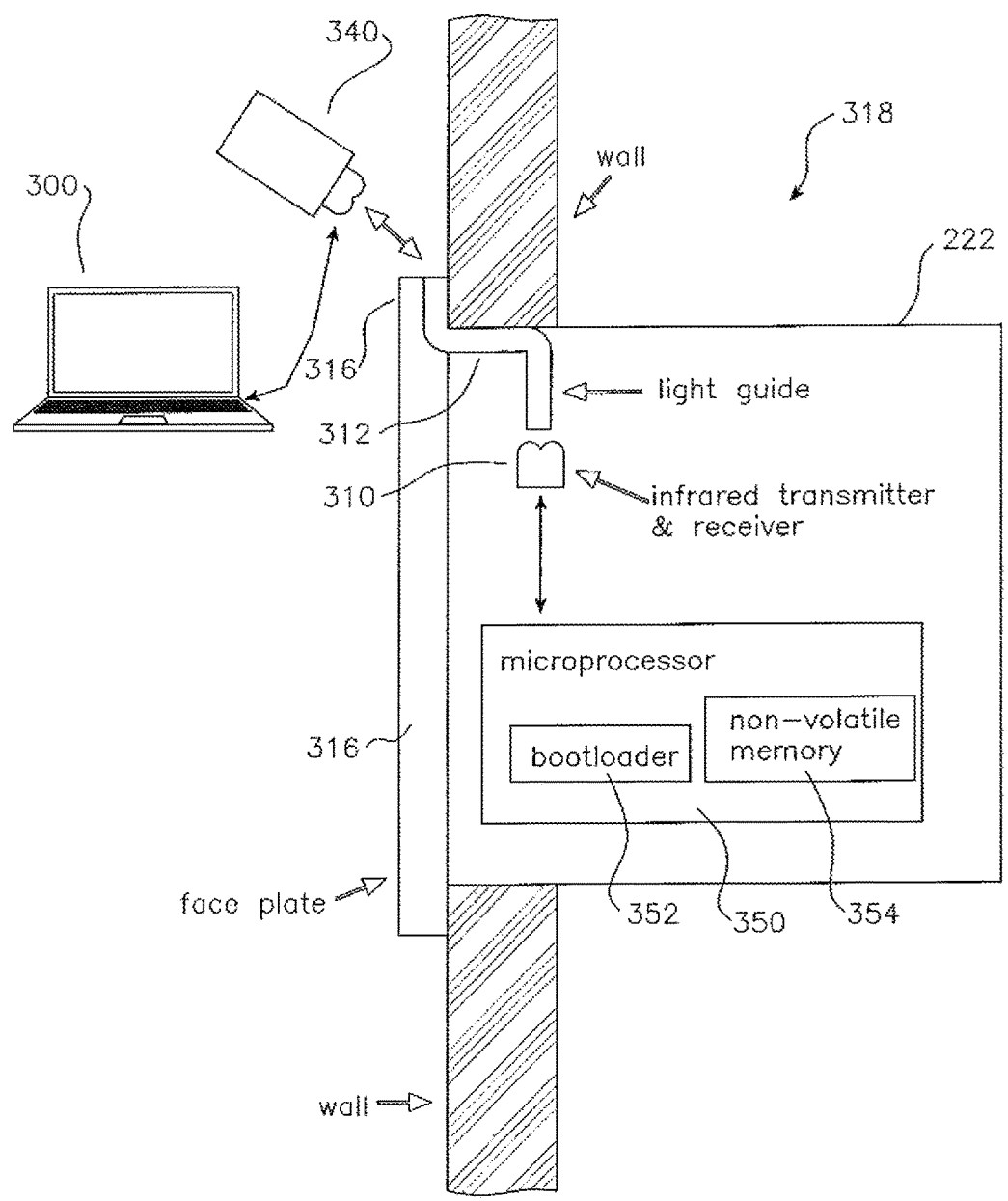
FIG. 7 is schematic sectioned view of the power switch assembly of FIG. 6 further provided with a remote programming facility.

With reference to FIG. 7, in a further embodiment of the invention, a light switch 318 is provided with a light guide 312. In one preferred embodiment, this may be the same light guide described for the automatic dimming described above, or may be a second light guide. In this instance the receiving end 316 is again discreetly located at the upper rim of the face plate 316 and leads to an infrared transmitter and receiver 310 located in the housing 322 of the switch 318.

Initial (and any subsequent upgrade) firmware in the microprocessor 350 responds to a specific sequence of data from the infrared receiver by running a "bootloader" sequence of code. The bootloader 352 is adapted to receive new switch programming code from an external device 340, such as an infrared emitting remote control, and loads the new programming code into non-volatile memory 354. The bootloader and non-volatile memory may be either internal or external to the microprocessor 350.

The external infrared emitting device 340 may in turn be programmed by connection to a computer 360.

Powering Without Neutral

The switch assembly of the present invention relies on a microprocessor and other electronic components. As such it requires a power supply to power its active internal components. Where the switch assembly is being used for switching general-purpose power outlets there is usually an active and neutral available at mains voltage from which power can be drawn and converted to DC utilising a suitable commercially available power supply chip.

Particularly in the case of power switching for lights, the circuit in which the switch assembly is located may not include a neutral connection. Or at least the neutral is only accessible via the load which the switching assembly is intended to control.

With reference to FIGS. 8 to 12 this situation is discussed and a solution provided which permits powering of the active internal components of the switch assembly where no direct connection to neutral is available. In particular forms the powering is reliable even when dimming of the load is contemplated.

Figure 8:
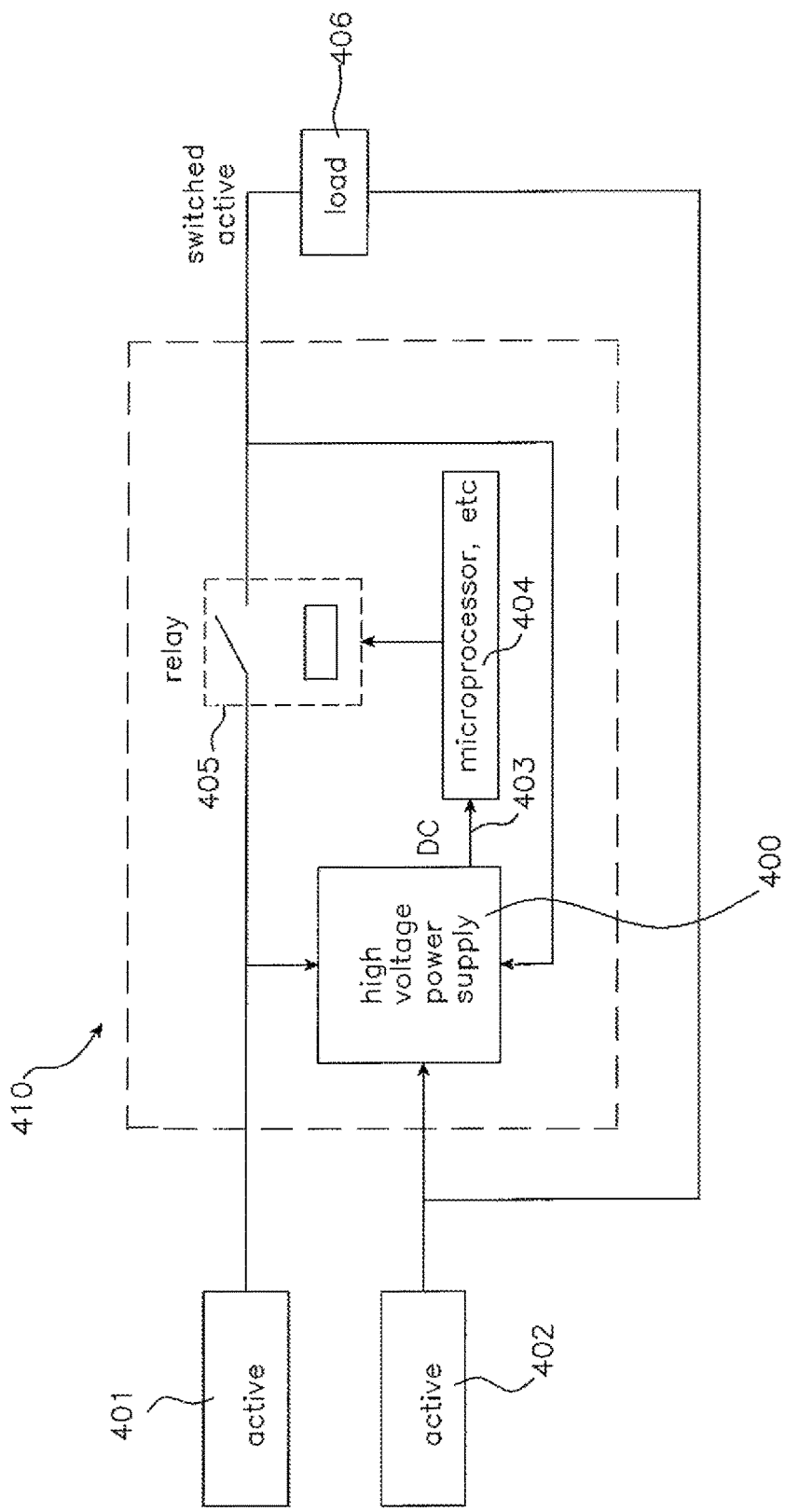
FIGS. 8 to 12 are schematic electronic circuits illustrating a method of powering embodiments of the switching assembly of the invention where there is no direct connection to an AC neutral available locally.

FIG. 8 illustrates the situation where a direct connection to neutral is available. In this instance a commercially available high voltage power supply 400 is supplied from active 401 and neutral 402 and makes DC power 403 available to microprocessor 404 and any other components within the switch assembly 410 which may require it. Because, in this instance, the high voltage power supply 400 receives its active and neutral connections directly it is not influenced by whether relay 405 (controlling active power to load 406) is in an open or closed condition.

Figure 9:
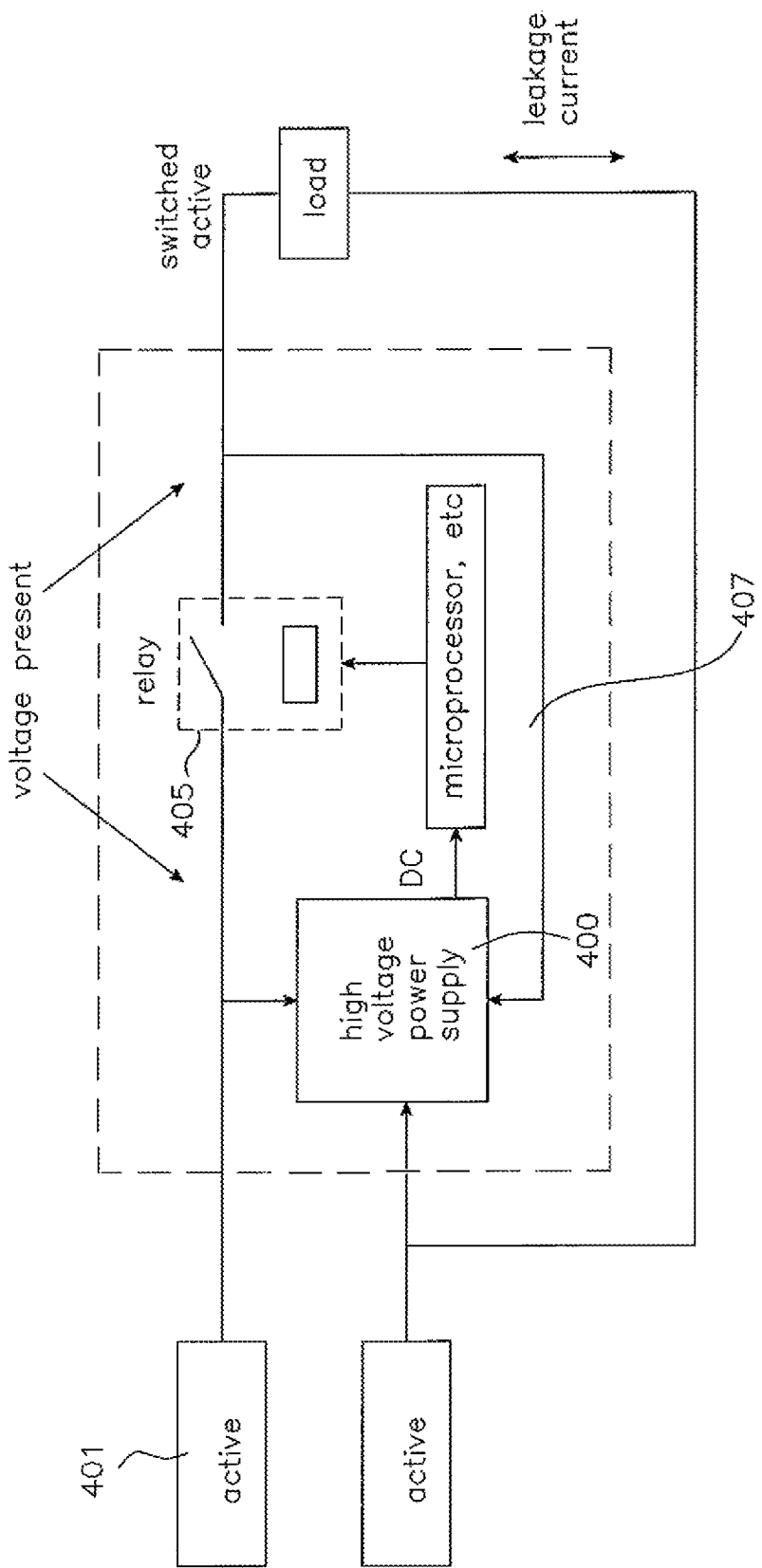
Figure 10:
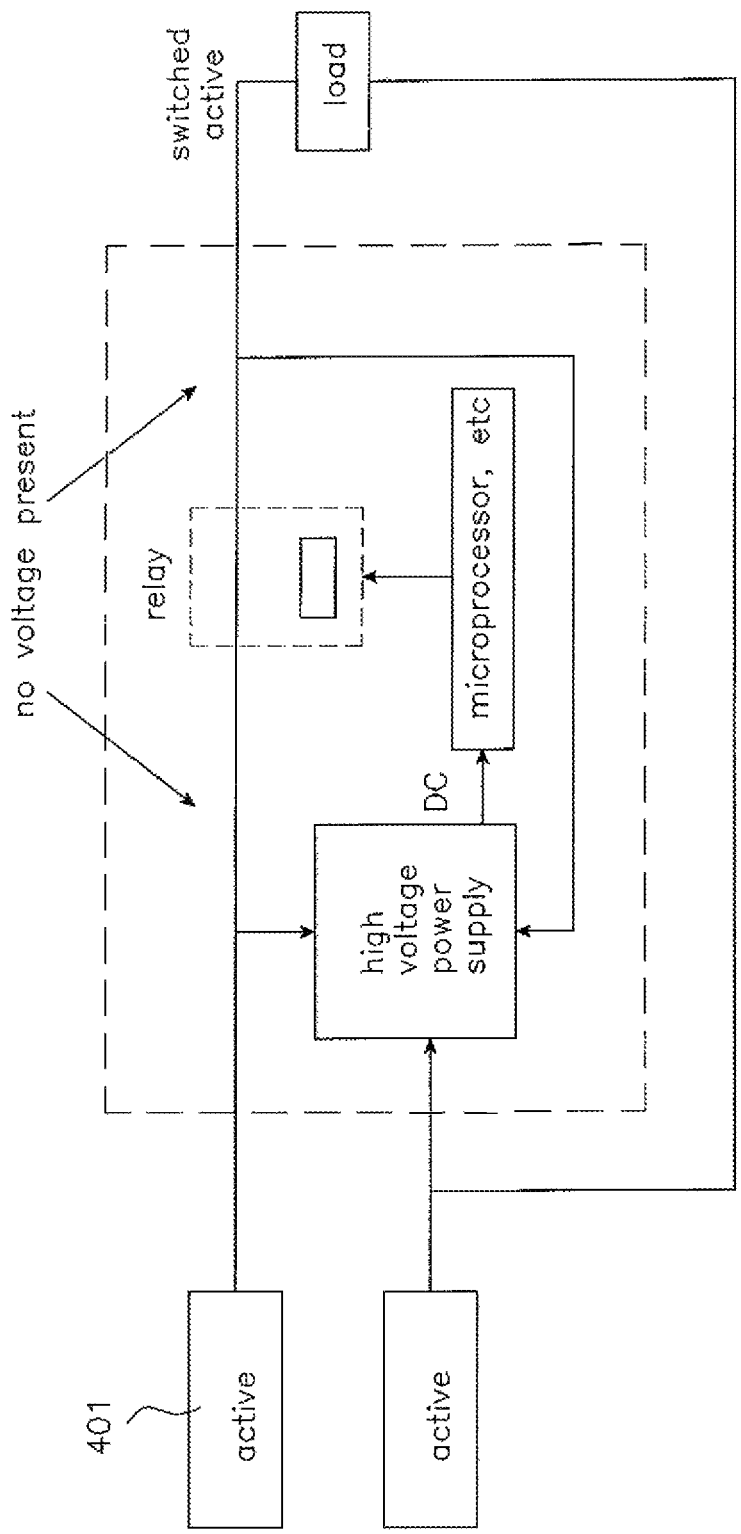

With reference to FIG. 9 there is illustrated diagrammatically the situation where there is no direct neutral connection available for the high voltage power supply 400. An indirect connection 407 is available which will provide a voltage difference as between active connection 401 and indirect neutral connection 407 when relay 405 is in an open condition. This voltage difference can be used to power the high voltage power supply 400. However, as illustrated in FIG. 10, if the relay 405 is closed (or if there are a number of relays all are closed) then there is no voltage drop as between active connection 401 and indirect neutral connection 407 and hence, in this situation, there is no power available to power the high voltage power supply 400.

Figure 11:
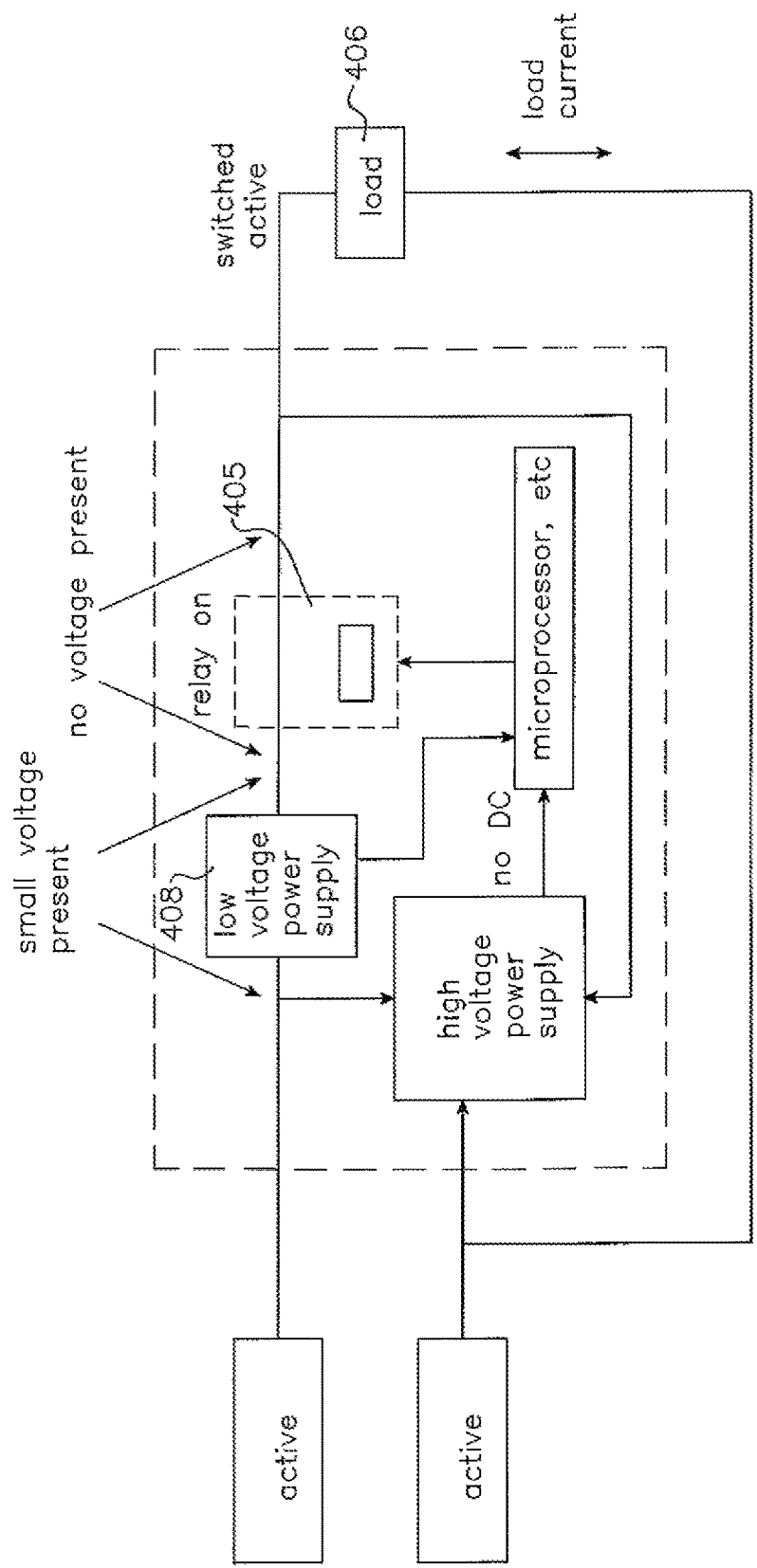
Figure 12:
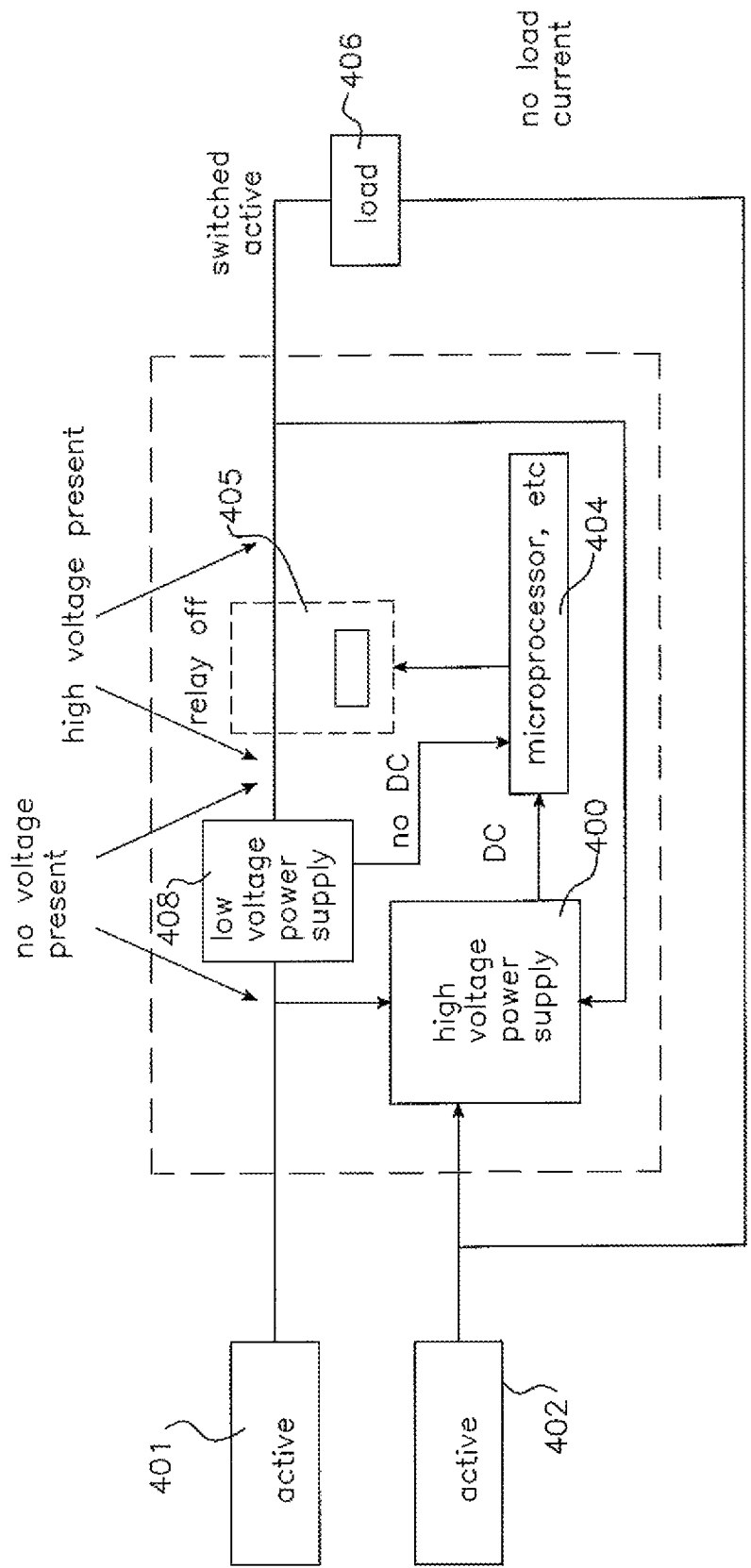

In one embodiment as illustrated in FIG. 11 the solution is to include a low voltage power supply 408 in series in the active connection 401 to load 406. This low voltage power supply comprises an internal load which in a preferred form can be adjusted depending on the current draw of load 406 to provide a stable voltage drop across it when relay 405 is closed sufficient to power microprocessor 404 and any other electronic load required within the switching assembly 410. When relay 405 is open power is again supplied to the high voltage power supply 400 by the voltage drop across the relay 405 itself as was the situation described with reference to FIG. 9. Broadly then local DC power is always available either via a voltage drop across relay 405 or via a voltage drop across the low voltage power supply 408.

IN USE/INDUSTRIAL APPLICABILITY

The switch assembly of the present invention provides an aesthetically attractive switching system which has no toggle switches or rotatable knobs susceptible to wear or damage. The combination of both switching and optional dimming functions within the relatively small space required by the sensors of the invention, allows the control of a relatively large number of light sources from a compact wall plate, or through RF receiver/transmitter technology.

When equipped with RF receiver and transmitter modules, different switch assemblies in a building may be programmed to communicate with each other so that an activation or de-activation input at one switch assembly may be acted upon by other switches programmed to respond.

Thus for example, one switch assembly suitably located may be programmed to communicate with all, or a selected number of light source switch assemblies in the building to either switch on or switch off the relevant light sources.

The same communication facility may be employed with suitable programming to disable/enable all, or a selection of power outlet sockets in a building.

Figure 5:
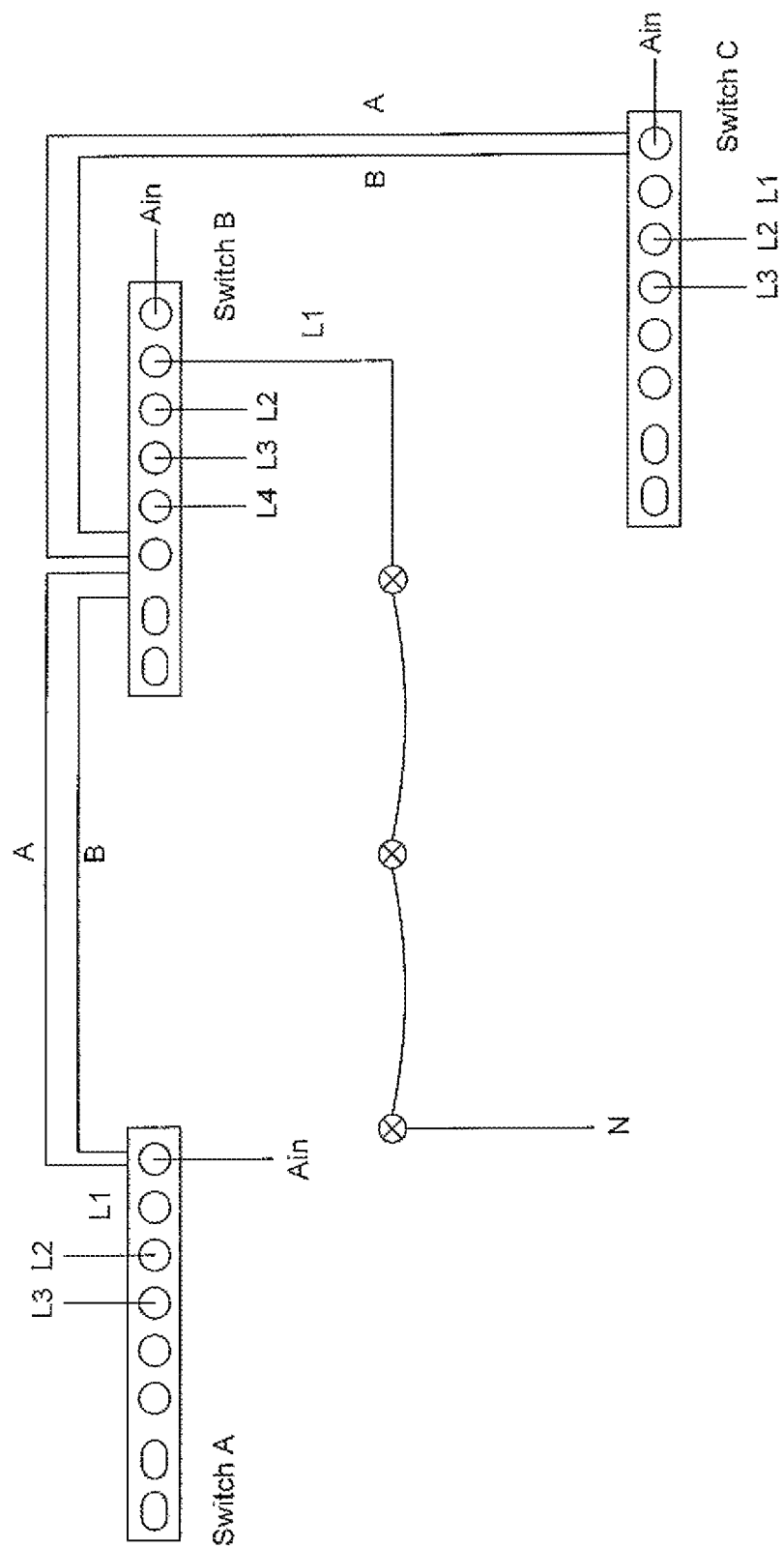
FIG. 5 is a schematic presentation of a number of the switch assemblies of FIGS. 1 to 3 arranged for intermediate switching.

Another advantage of the switching system of the invention is that, as shown in FIG. 5 more than two, indeed an almost unlimited number of switch assemblies may be arranged as an intermediate switching array to operated the same light source or light sources connected to just one of the switch assemblies in the array.

It will be understood that the switch assemblies of the invention when equipped with RF transmitting modules, need not be hard wired to the light source or other electrical device which a switch of the switch assembly controls. Connection to the remote light source or electrical device may be effected wirelessly by an RF receiver connected to or incorporated in the light source or electrical device.

The simple locking and unlocking facility of power outlets afforded by the arrangement of the present invention as described in the Second Preferred Embodiment above, clearly provides a convenient and important safety measure against accidental electrocution should a child insert a conducting object into a power socket.

As well as being easily cleaned and aesthetically pleasing, the switch system of the present invention can be more readily operated by people not having full dexterous use of the hands.

The fact that the relays and other components are solid state eliminates the possibility of arcing. As a bonus, the illumination of the sensor positions within the front face plate is particularly convenient at night.

The above describes only some embodiments of the present invention and modifications, obvious to those skilled in the art, can be made thereto without departing from the scope of the present invention.

The invention claimed is:

1. A mains electrical power outlet assembly; said power outlet assembly including at least one power outlet socket adapted to receive a plug of an electrical appliance or electrical extension cord; said power outlet assembly including at least one sensing module operating a power switching module and a programmable and reprogrammable microprocessor; said sensing module including a sensor responsive to proximity to said sensor of selected objects; proximity of a said selected object switching status of a said power outlet socket from a current state to another state; and wherein said at least one power outlet socket is switched to a locked deactivated state if a sensible object remains within sensing distance of an associated said sensor of said at least one power outlet socket for at least a first predetermined duration; said locked deactivated state being reversed to an activated state when a said sensible object is maintained within said sensing distance of said associated sensor for at least a second predetermined duration, wherein said assembly includes an infrared transmitter and receiver module; said module adapted to receive programming data via an infrared data stream from a remote infrared data transmitter; said data stream passing to said module via a light guide provided between an upper rim of a face plate of said assembly and said module.

2. The power outlet assembly of claim 1 wherein said assembly is provided with an automatic dimming of light emitters; said light emitters indicating status of power switches of said assembly; an ambient light sensor reacting to ambient light at a switch assembly; said ambient light sensor receiving ambient light input via a light guide provided between said upper rim of said face plate of said assembly and said ambient light sensor.

3. The power outlet assembly of claim 1 wherein said assembly includes an internal load in series with at least one conductor and wherein a voltage drop across said internal load is utilised to provide power to said microprocessor during at least a portion of the operating cycle of the power switching module.

4. An electrical switch assembly for switching the state of at least one conductor of a mains alternating power supply; said electrical switch assembly including a housing containing a sensing module and a power switching module; said switch assembly characterized in that electrical power switched by said switch assembly is mains alternating power; said switch assembly including a microprocessor in communication with the sensing module and the power switching module for switching the state of the at least one conductor; said assembly including an internal load in series with said at least one conductor and wherein a voltage drop across said internal load is utilised to provide power to said microprocessor during at least a portion of the operating cycle of the switch assembly, wherein the power switching module includes a relay and the assembly utilises voltage drop across terminals of the relay of the power switching module to provide power to said microprocessor.

5. The assembly of claim 4 wherein the assembly utilises voltage drop across a plurality of relay terminals of the power switching module to provide power to said microprocessor as a first choice and utilises the voltage drop across said internal load to provide power to said microprocessor as a second choice.

6. The switch assembly of claim 4 further including an ambient light sensor in communication with the microprocessor; the microprocessor programmed to increase output voltage from the switch assembly as the amount of ambient light sensed by the ambient light sensor reduces thereby to increase the light output from lights supplied by the switch assembly as ambient light decreases.

7. An electrical switch assembly for switching the state of at least one conductor of a mains alternating power supply; said electrical switch assembly including a housing containing a sensing module and a power switching module; said switch assembly characterized in that electrical power switched by said switch assembly is mains alternating power; said switch assembly including a microprocessor in communication with the sensing module and the power switching module for switching the state of the at least one conductor; said assembly including an internal load in series with said at least one conductor and wherein a voltage drop across said internal load is utilised to provide power to said microprocessor during at least a portion of the operating cycle of the switch assembly, wherein the assembly utilises voltage drop across a plurality of relay terminals of the power switching module to provide power to said microprocessor as a first choice and utilises the voltage drop across said internal load to provide power to said microprocessor as a second choice.

* * * * *